United States Patent [19]

Steele

[11] Patent Number: 4,835,394

[45] Date of Patent: May 30, 1989

[54] CABLE ASSEMBLY FOR AN ELECTRICAL SIGNAL TRANSMISSION SYSTEM

[75] Inventor: Douglas S. Steele, West Chester, Ohio

[73] Assignee: General Electric Company, Cincinnati, Ohio

[21] Appl. No.: 80,289

[22] Filed: Jul. 31, 1987

[51] Int. Cl.$^4$ ............................................. G01T 1/185
[52] U.S. Cl. .................. 250/385.1; 250/374; 174/36; 174/103; 174/117 F
[58] Field of Search .................. 250/385.1, 374, 336.1; 174/36, 117 F, 103

[56] References Cited

U.S. PATENT DOCUMENTS

| | | | |
|---|---|---|---|
| 3,340,353 | 9/1967 | Mildner | 174/36 |
| 3,795,540 | 3/1974 | Mildner | 117/226 |
| 4,234,759 | 11/1980 | Harlow | 174/104 |
| 4,327,246 | 4/1982 | Kincaid | 174/36 |
| 4,468,089 | 8/1984 | Brorein | 350/96.23 |
| 4,475,006 | 10/1984 | Olyphant, Jr. | 174/36 |
| 4,479,059 | 10/1984 | Morris et al. | 250/385.1 |
| 4,510,346 | 4/1985 | Bursh, Jr. et al. | 174/36 |
| 4,570,071 | 2/1986 | Sippel et al. | 250/385.1 |
| 4,613,313 | 9/1986 | Steele | 445/28 |
| 4,678,865 | 7/1987 | Sherwin | 174/103 |
| 4,751,614 | 6/1988 | Mehnert | 174/36 |

*Primary Examiner*—Carolyn E. Fields
*Attorney, Agent, or Firm*—Derek P. Lawrence; Nathan D. Herkamp

[57] ABSTRACT

A cable assembly for an electrical signal transmission system comprises a plurality of elongated conductors, a conductive shield surrounding each conductor, and a dielectric layer between each shield and its respective conductor. The shielded conductors are embedded in a dielectric material and the dielectric material is wrapped in a double conductive shield. Adhesive layers are located between the double shield and the dielectric material and between the two shields making up the double shield. This cable assembly results in a signal transmission apparatus which has increased immunity to the effects of external electromagnetic fields, electrostatic charge, and mechanical vibration. It is particularly useful in transmitting low level signals produced by ionization detectors used in X-ray inspection apparatus.

9 Claims, 5 Drawing Sheets

CABLE ASSEMBLY FOR AN ELECTRICAL SIGNAL TRANSMISSION SYSTEM

FIELD OF THE INVENTION

This invention relates to electrical signal transmission. More specifically, this invention relates to electrical signal transmission with reduced noise and distortion.

In one specific example of the invention, charge resulting from ionization of dielectric by electromagnetic energy is transferred by way of a cable assembly from an ionization detector to a charge storage apparatus. Transfer of charge by way of the cable assembly occurs with reduced introduction of spurious signals due to electromagnetic or electrostatic interference or mechanical vibrations.

BACKGROUND OF THE INVENTION

It has been found advantageous to inspect manufactured parts such as jet engine turbine blades by passing penetrating radiation such as X-rays through those inspected parts. The intensity of the penetrating radiation after having passed through a part indicates the nature of the part and may be used to create an image of the part so that any flaws or defects may be observed.

Reliable observation of flaws in parts such as turbine blades requires a high degree of resolution in any detector of penetrating radiation used in such inspection systems. To achieve high resolution, an ionization detector in the form of a sealed chamber containing closely spaced detector elements and pressurized dielectric such as xenon gas is used. Radiation that has passed through the part being inspected is admitted to the chamber through a radiation permeable window. The radiation admitted to the chamber ionizes the dielectric to an extent related to its intensity. The charge created by that ionization is collected upon the detector elements and transmitted to charge storage circuitry outside the ionization detector, which may be a charging circuit comprising a resistor in series with a capacitor. Part of the circuitry involved in transmitting such charge may include a flexible electric cable connecting the ionization detector with the charge storage circuitry. Because many detector elements must be connected with charge storage circuitry, this cable is most conveniently in the form of one or more ribbon cables each containing a row of closely spaced parallel conductors. Each of the conductors is electrically connected to a detector element and to a resistor in series with a capacitor.

The amount of charge created in such ionization detectors is very small. The current resulting from transfer of that amount of charge to the storage circuitry is on the order of picoamperes. The circuitry associated with the collection and storage of such small amounts of charge is particularly prone to phenomena which may adversely impact the accurate transmission of charge from the ionization detector to the charge storage circuitry. Thus, it is particularly difficult to ascertain the true amount of penetrating radiation entering the ionization detector which makes it difficult to produce accurate images of a part being inspected.

Factors which have been found to impair the accurate transmission of charge created in the ionization detector are numerous and difficult to eliminate. Those factors include electromagnetic interference such as that produced by fluorescent lighting in the vicinity of the inspection apparatus. They also include problems caused by electrostatic charge build up and discharge in the vicinity of the inspection apparatus. To give some idea of the magnitude of this electrostatic charge based problem, merely combing one's hair in close proximity to the transmission system (e.g. 5-10 feet away) influences the charge transfer process. Clothing, such as polyester clothing, which tends to pick up an electrical charge, likewise influences the charge transfer process when worn by people in the same vicinity of the inspection apparatus. An additional difficulty in accurately transferring charge from the ionization detector is caused by mechanical vibration in the vicinity of the circuitry through which the charge flows. Even breathing near or walking past the inspection apparatus has a noticeable effect.

None of these phenomena can be entirely eliminated from the environment of the inspection equipment. Therefore, efforts must be made to increase the immunity of the circuitry involved in charge transfer to the effects of those phenomena. Any significant length of flexible cable used for transferring charge is particularly susceptible to the ill effects of the phenomena described above. Accordingly, ways of increasing the immunity of the cable to the effects of phenomena which may distort signals from the ionization detector that flow through the cable are desirable.

One way to try to avoid the problems with using flexible cable is to shield each of the conductors in the cable. Such a cable in the form of a ribbon cable having a number of individually shielded conductors is available commercially and was tried as a solution to those problems. However, it was found that shielding only the individual conductors in a ribbon cable is insufficient. The next thing that was tried was to wrap an additional conductive shield around the entire shielded cable. It was found that this arrangement helped to reduce the electrostatically based interference, but the electromagnetically based interference and the vibrationally induced interference were still unacceptable. An additional conductive shield was then wrapped around the first shield. This additional shield reduced the electromagnetic interference to acceptable levels, but the inspection apparatus was still subject to vibrational effects. It was only after the first shield was adhered to the cable and the second shield was adhered to the first shield in accordance with the invention of this application that the effects of the vibrational problems were also reduced to acceptable levels.

The invention of this application thus reduces the effects of external interference on signals carried by electric cables. As is apparent from the description below, this may be accomplished in a simple and inexpensive manner through straightforward assembly of readily available components. The invention of this application is useful in any situation where interference with accurate signal transmission is a concern. It is particularly useful in situations involving low level signals, such as those encountered in the transmission of signals from ionization detectors used in high resolution inspection apparatus.

SUMMARY OF THE INVENTION

It is an object of the invention to avoid the problems of signal transmission systems described above, particularly those problems involved with the transmission of low level signals over flexible cable.

It is also an object of the invention to provide a signal transmission apparatus with reduced response to the effects of external interference caused by electromagnetic fields, electrostatic charge, and mechanical vibration.

It is an additional object of the invention to provide a signal transmission apparatus which has reduced signal distortion and noise.

It is a further object of the invention to provide a signal transmission apparatus in the form of a cable assembly which has a uniform, easily controlled impedance.

Other objects and advantages of the invention are either specifically described elsewhere in this application or are apparent from the description of the invention.

In accordance with those objects and advantages, the invention of this application relates to an electric cable assembly which comprises a plurality of elongated conductors oriented such that the axes of the conductors are generally parallel. Each of those conductors is surrounded by a conductive shield separated from its respective conductor by a dielectric layer. A dielectric material encases the plurality of shielded conductors. A first conductive shield surrounds the dielectric material and is attached to the dielectric material by way of a first adhesive layer between the first conductive shield and the dielectric material. A second conductive shield surrounds the first conductive shield and is attached to the first conductive shield by way of a second adhesive layer between the first and second shields.

In a more specific example of the invention, the cable assembly defined above is a part of a signal transmission apparatus which transfers charge resulting from ionization of dielectric in a sealed chamber to charge storage apparatus outside the chamber.

DETAILED DESCRIPTION OF THE INVENTION

Figure 1:
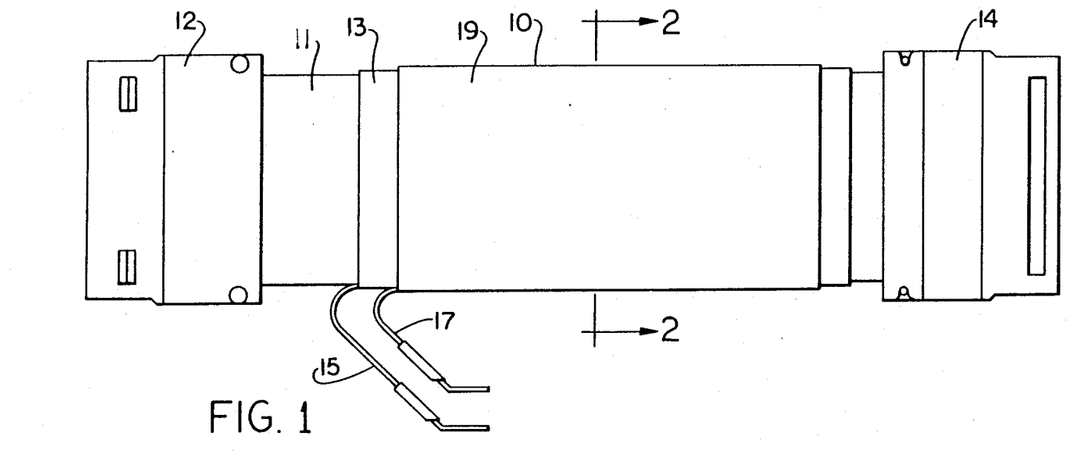
FIG. 1 is a top view of an example of an electric cable assembly in accordance with the invention.

FIG. 1 shows an electric ribbon cable assembly in accordance with the invention of this application. The cable assembly comprises a center ribbon shaped section 10 and two multiple pin connectors 12 and 14 attached to the ends of the center section. The center section comprises a centrally located shielded ribbon cable 11, a first shield 13 wrapped completely around the ribbon cable 11, and a second shield 19 wrapped completely around the first shield 13. The first and second shields are connected to drain wires 15 and 17, terminated in spade lugs, which are to be connected to a circuit ground.

The ribbon cable 11 contains a row of elongated conductors insulated from one another. Each conductor is terminated in either a male or female conductive member in the connectors 12 and 14 to facilitate electrical connection of the conductor to other circuitry. Such electrical connection may be accomplished by plugging the connector at one end of the cable assembly to a mating connector which is connected to the other circuitry. For example, the mating connector may be mounted on a printed circuit board and connected to conductive tracks associated with the circuit board. The connector at the other end of the cable assembly may also be plugged into a mating connector.

The cable assembly shown in FIG. 1 may thus be used to connect a plurality of electrical circuits together. As more fully explained below, the signals transmitted along the cable assembly of FIG. 1 will be less affected by external interference than signals transmitted along prior cables.

Figure 2:
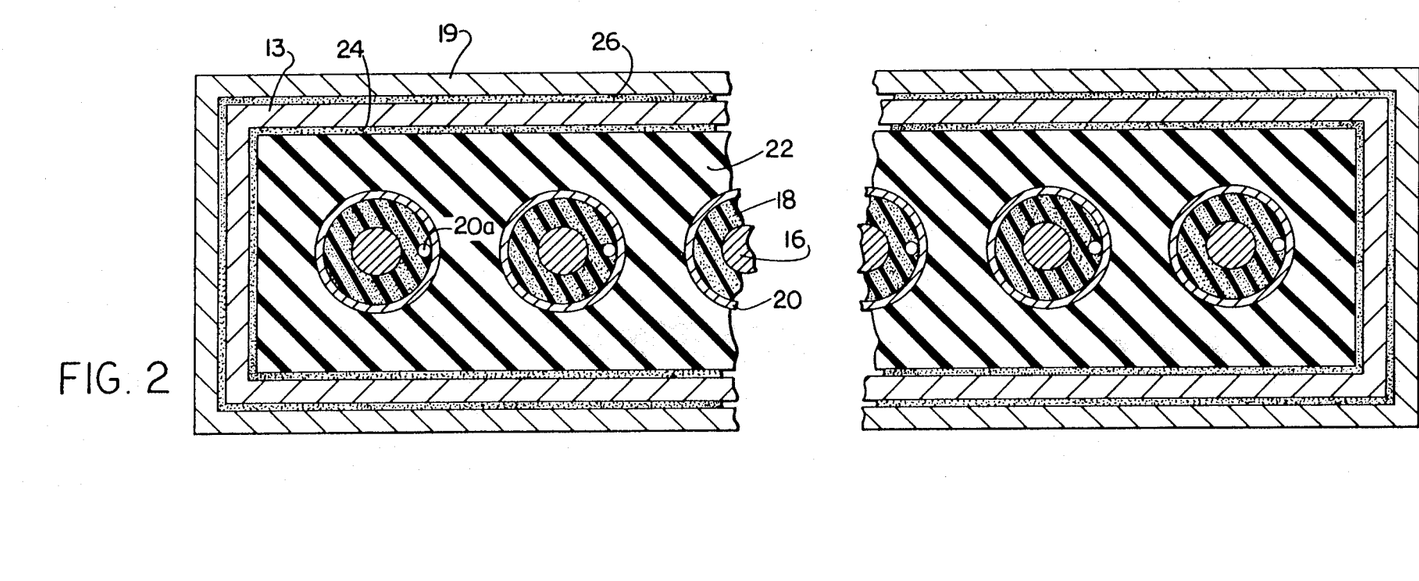
FIG. 2 is a cross sectional view of the FIG. 1 cable assembly taken along line 2—2 in FIG. 1.

FIG. 2 is a cross section of the cable assembly of FIG. 1. It illustrates the structure of the center section 10 of the cable assembly. That structure comprises a row of generally cylindrical conductors 16. The longitudinal axes of the conductors are generally parallel to each other. A tubular dielectric layer 18 insulates and separates each conductor 16 from a conductive shield 20 which surrounds each conductor. The shields are to be connected to circuit ground by means of drain wires 20a. The row of shielded conductors is encased, and insulated from one another, in a dielectric material 22.

The conductors may be any good conductive material such as copper. The dielectric layer may be any good insulator such as a foamed polyethylene dielectric. The shield may be any material known to be suitable for use as a shield, such as aluminized Mylar ® film. The dielectric material 22 may be polyvinyl chloride.

The structure described thus far comprises the ribbon cable 11 of FIG. 1. An example of such ribbon cable may be a 17 conductor Model No. 1-226464-7 coaxial ribbon cable manufactured by AMP, Incorporated. The connectors 12 and 14 may be Model No. 1-226733-4 connector kits also manufactured by AMP, Incorporated.

The first, inner shield 13, which may be a laminate of copper and polyester, for example, a Model No. B-03E060 shield manufactured by W. L. Gore & Associates, Inc., is adhered to the ribbon cable 11 by a layer of adhesive 24. The adhesive may be a light to medium tack transfer adhesive, such as 3M brand 924 adhesive.

In assembling the shield 13 to the ribbon cable 11, a uniform layer of the adhesive is applied to the entire surface of the ribbon cable 11 which will be covered by the shield 13. Application of the adhesive preferably is accomplished with a 3M brand ATG-752 gun used according to the manufacturer's directions. After application of the adhesive to the ribbon cable, the shield then is wrapped uniformly about the ribbon cable.

The aim in applying a layer of adhesive to the ribbon cable and wrapping the shield about the ribbon cable is to get uniform and complete contact between the ribbon cable and the shield over their entire surface areas without air pockets or other gaps between the cable and the shield. This results in uniform impedance per unit length along the entire length of the cable assembly. It also results in the shield being securely fixed with respect to the ribbon cable along the entire length of the cable assembly which is helpful in preventing the shield from shifting with respect to the ribbon cable.

The second, outer shield 19 may also be a copper polyester laminate, for example, a Model No. B-03E070 shield manufactured by W. L. Gore & Associates, Inc. It is adhered to the first shield 13 by a layer of adhesive 26, which may be the same adhesive used for layer 24. The shield 19 is adhered to the shield 13 in the same manner as shield 13 is adhered to ribbon cable 11 to provide complete and uniform contact between shields 13 and 19 and to prevent shifting of the shields with respect to each other and to the ribbon cable.

It has been found that the cable assembly described above reduces the effects of external interference on signals carried by the cable, which is particularly desirable when those signals are low level signals such as those produced by ionization detectors in inspection apparatus using penetrating radiation. It has been found that the inner shield reduces the effects of electrostatically based interference and the outer shield reduces the effects of electromagnetically based interference.

It also has been found that the adhesive renders the cable rigid and prevents shifting of the shields with respect to each other and with respect to the ribbon cable, which reduces the effects of mechanical vibrations on the cable assembly. Mechanical vibration tends to change the geometry of the cable assembly, which changes the cable assembly's capacitance. Variation of this capacitance causes noise or distortion to be superimposed on a signal being carried by the cable assembly. The rigidity of the cable assembly and the resistance to shifting of the shields keeps the capacitance of the cable assembly constant even in the presence of mechanical vibrations.

FIGS. 3–7 depict an example of an apparatus in which the cable assembly of FIGS. 1 and 2 is particularly useful. That apparatus transmits signals related to the production of charge in an ionization detector. Such an apparatus may be used to inspect parts for flaws.

Figure 3:
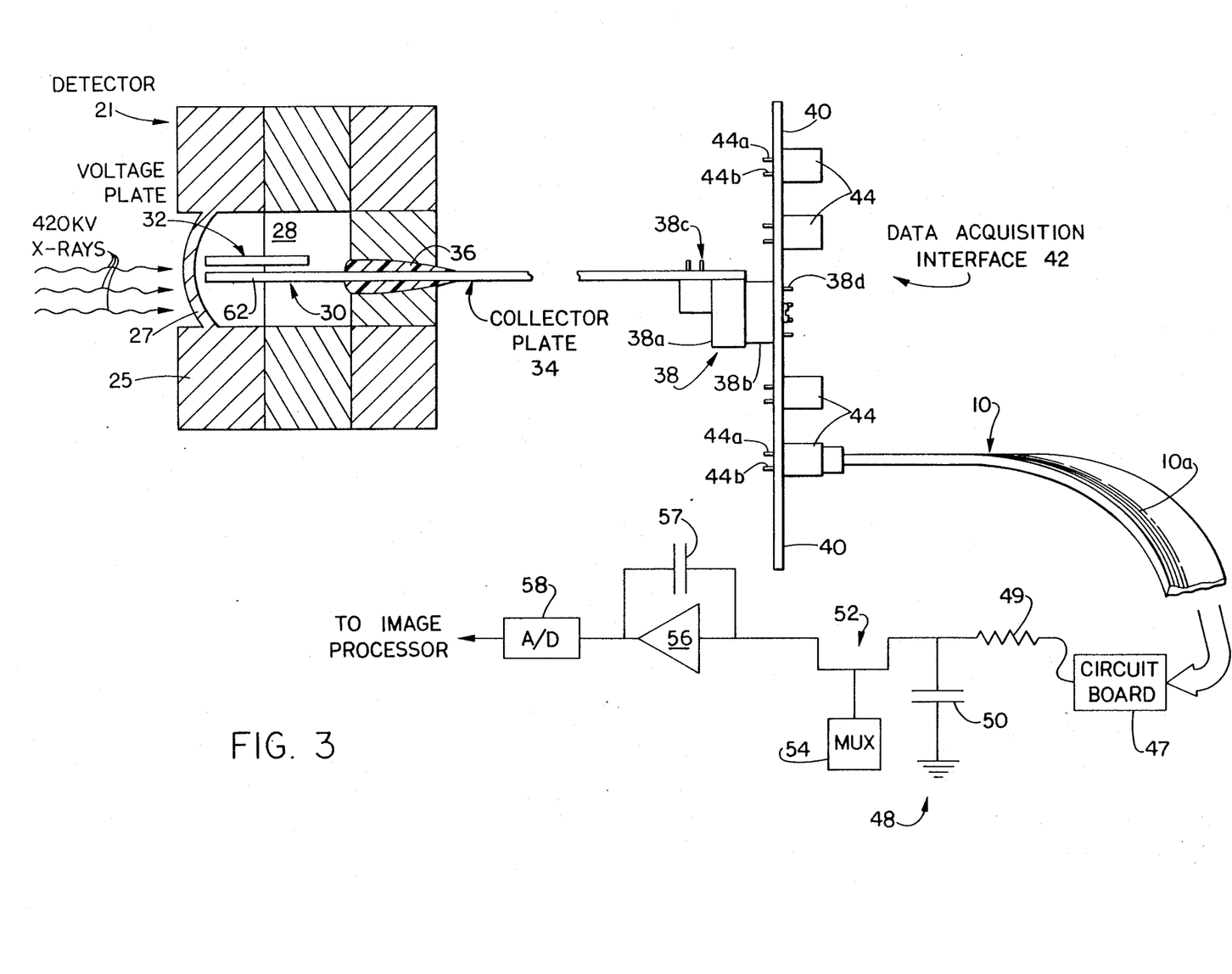
FIG. 3 is a side view of an example of the invention using the cable assembly of FIG. 1 in an xray inspection apparatus.

FIG. 3 shows an ionization detector 21 receiving X-rays of, for example, 420 kv from a source of X-rays not shown in FIG. 3. The ionization detector 21 has an X-ray impermable housing 25 with an elongated slot or window 27 which is permeable to X-rays. X-rays pass through the window 27 and enter a sealed chamber 28. The chamber 28 contains a pressurized gaseous dielectric, such as xenon, and encloses a voltage plate 32 and part of a collector plate 34. X-rays passing through the window 27 ionize the gaseous dielectric. Charge created by the ionization of the gaseous dielectric between the collector and voltage plates is swept to the collector plate 34 by an electric field applied between plates 32 and 34. The amount of charge deposited on the collector plate 34 in a given time is related to the intensity of the X-rays passing through the window.

Figure 4:
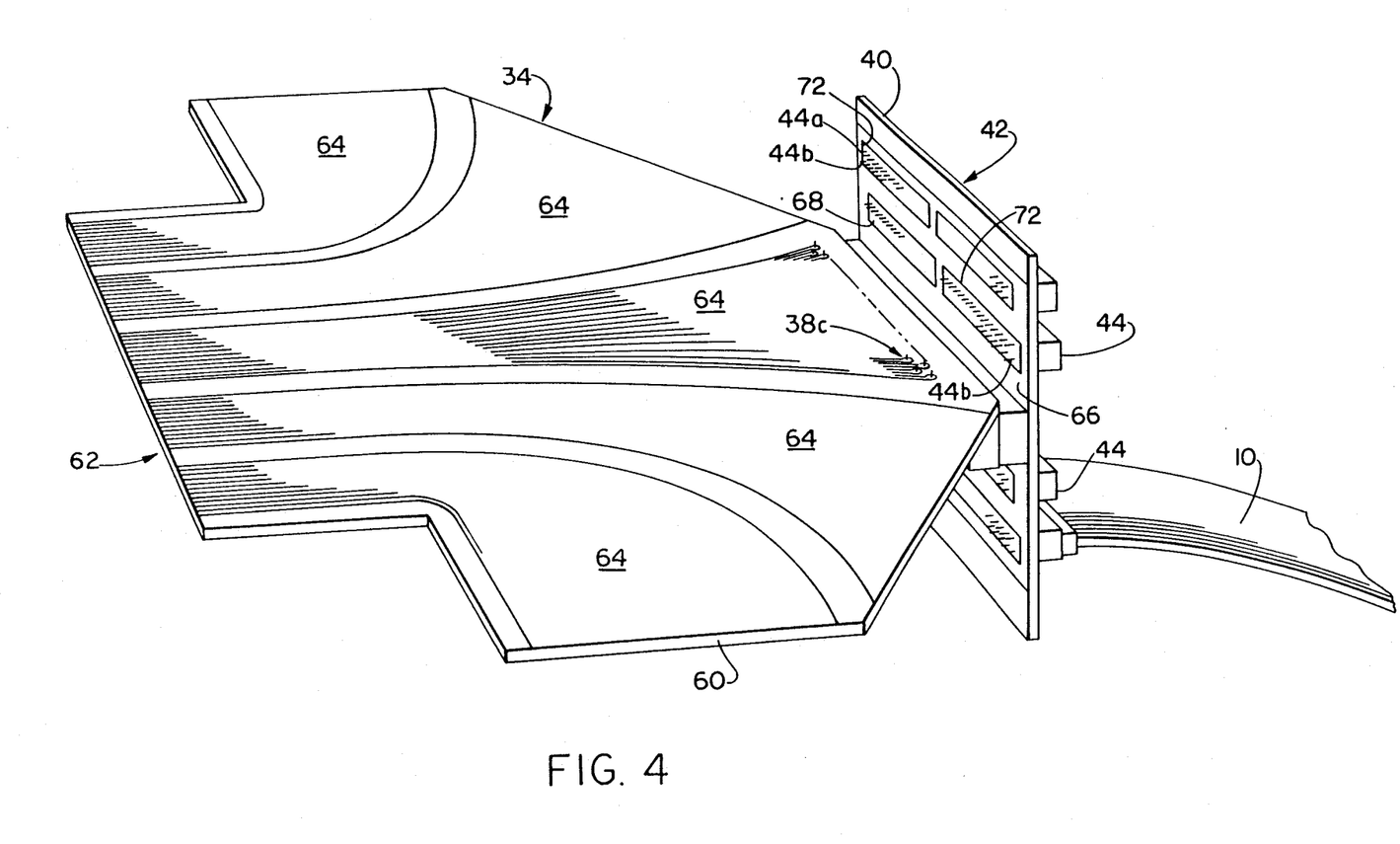
FIG. 4 is a perspective view of a part of the apparatus of FIG. 3.

The collector plate 34 is a dielectric substrate in the form of a printed circuit board onto which is deposited a number of conductive detector traces 64, shown in FIG. 4, which are elongated and separated from each other. They are situated generally perpendicular to the plane of window 27 and in a line across the width of window 27. Charge created by the ionization of the gaseous dielectric in chamber 28 is deposited on those traces and conducted out of the chamber to a data acquisition system and image processor. The detector elements thus conduct signals representing the intensity of electromagnetic energy entering the chamber as a function of position along the width of the window 27.

The collector plate 34 passes through the housing 25 and an epoxy seal 36 insulates the collector plate 34 from the housing 25 where the collector plate passes through the housing. A member 38a of a high density connector 38 is connected to the detector traces 64 that extend to the edge of the collector plate outside the chamber. The high density connector may be a 128 pin header, Part No. 530733-9, manufactured by AMP, Incorporated. As shown in FIG. 4, the collector plate has five such edges, each of which has a high density connector connected to the detector traces extending to its respective edge of the collector plate. For clarity, only one such connector is shown in FIG. 4.

A member 38b of the high density connector 38 is plugged into member 38a and is mounted on one side of a substrate 40 forming a printed circuit interface board which is a part of a data acquisition interface 42. Ribbon connectors 44 are mounted on the other side of substrate 40. A cable assembly 10, like the one shown in FIGS. 1 and 2, with a data channel 10a for each of the traces connected to its respective ribbon connector, is plugged into each ribbon connector 44. Each of the ribbon connectors may be a 34 pin connector, Part No. 87478-5, manufactured by AMP, Incorporated. Inspection data is carried by the cable assemblies 10 through a printed circuit board 47 to a sampling circuit 48 comprising a resistor 49 in series with a capacitor 50. The sampling circuit 48 also comprises an FET 52 which connects the junction of the resistor 49 and capacitor 50 to the input of an amplifier 56. In sampling circuit 48, there also is a resistor 49, capacitor 50, and FET 52 for each of the data channels 10a. For clarity, only one resistor 49, capacitor 50, and FET 52 are shown in FIG. 3. One example of such a sampling circuit is an Analogic 640 channel Data Acquisition System.

Current produced in response to the ionization taking place in chamber 28 charges the capacitor 50 through resistor 49. The FET 52 is connected to a multiplexer 54 which switches on the FET 52 at predetermined times. The FET 52, when switched on, discharges the capacitor 50 into the capacitor 57 connected between the output and the input of an amplifier 56. The voltage across capacitor 57 is amplified by amplifier 56 and converted to a digital signal by an analog to digital converter 58. This digital signal may be processed into a visual image of the part under examination. One means for processing such a visual image is referred to in U.S. patent application Ser. No. 832,511.

The sampling circuit 48 comprises other like resistors 49, other like capacitors 50 which accumulate charge deposited on their respective detector elements, and other like FET's 52 which are periodically switched on by the multiplexer 54 to sample the voltage on the capacitors 50 by discharging the charge accumulated on each of the detector elements into capacitor 57, amplifier 56, and analog to digital converter 58.

FIG. 4 shows connection of the collector plate 34 to one of the substrates 40. Connections of the collector plate 34 to the other substrates 40 at the other edges 60 are the same as the connection shown in FIG. 4. The collector plate 34 has a flared surface to allow the closely spaced detector traces 64 to spread sufficiently for connection to high density connectors located at edges 60. A flange 62 on the collector plate is positioned in the detector housing 24, as shown in FIG. 3. Conductive detector traces 64, made of nickel, for example, are deposited on top of the collector plate 34. These traces 64 extend from the front edge of flange 62 to the edges 60 and the mounting pins 38c of a high density connector member 38a located at each of the edges 60.

Charges collected on the collector plate 34 are conducted by the detector traces from the flange 62 to the edges 60. The charges pass to the substrates 40 through the high density connectors 38. A conductive film 66, made of gold, for example, is deposited on the high density connector side of substrate 40. The deposited film 66 is connected to an electrical ground. Windows 68 are defined in the grounded film 66 on the substrate 40. The ribbon connectors 44 are mounted on the other side of the substrate 40 directly opposite the windows 68. Mounting pins 44a and 44b of the ribbon connectors 44 pass through holes in the substrate 40 and are soldered to the substrate. One row of pins 44a of each ribbon connector 44 is joined by a trace 72 to the ground film 66. The other row 44b is connected to conductive traces 64 through conductive traces deposited on the ribbon connector side of the substrate 40 and through the high density connector 38.

Figure 5:
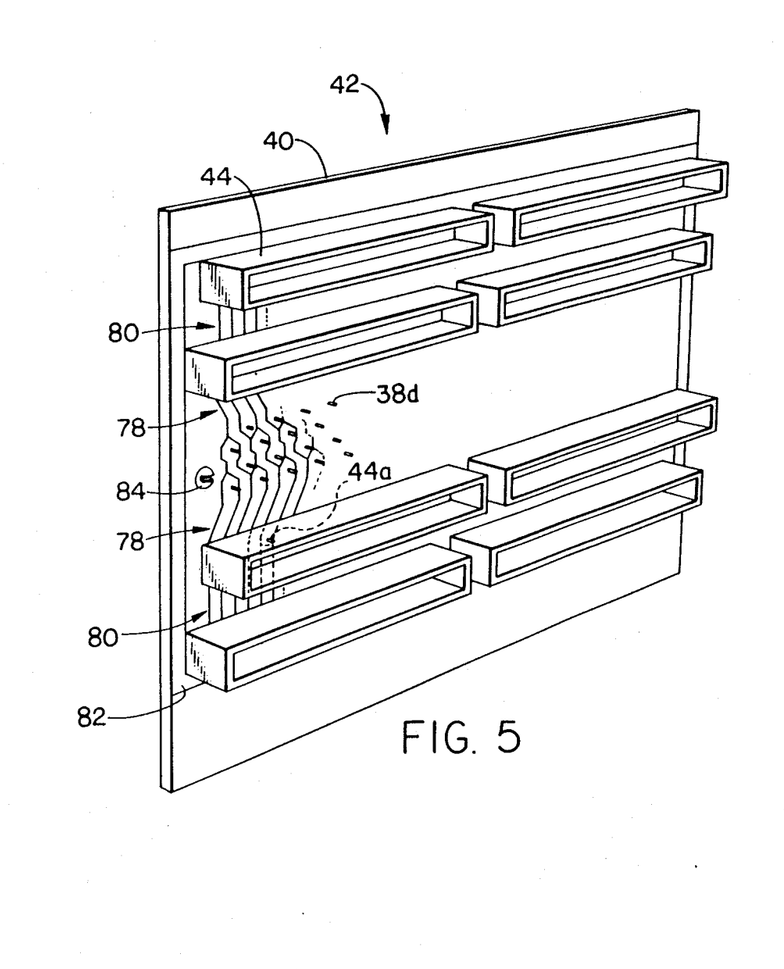
FIG. 5 is a perspective view of a part of the FIG. 3 apparatus shown in FIG. 4.

FIG. 5 shows the ribbon connector side of the substrate 40. Eight ribbon connectors 44 are mounted in four rows on the substrate 40 and are surrounded by a grounded film 82. Mounting pins 38d of the member 38b of the high density connector 38 extend through the substrate 40 and are connected to pins 44b of the ribbon connectors by conductive traces 78 and 80. A threaded nut 84 secures the high density connector member 38b to the substrate 40.

Figure 6:
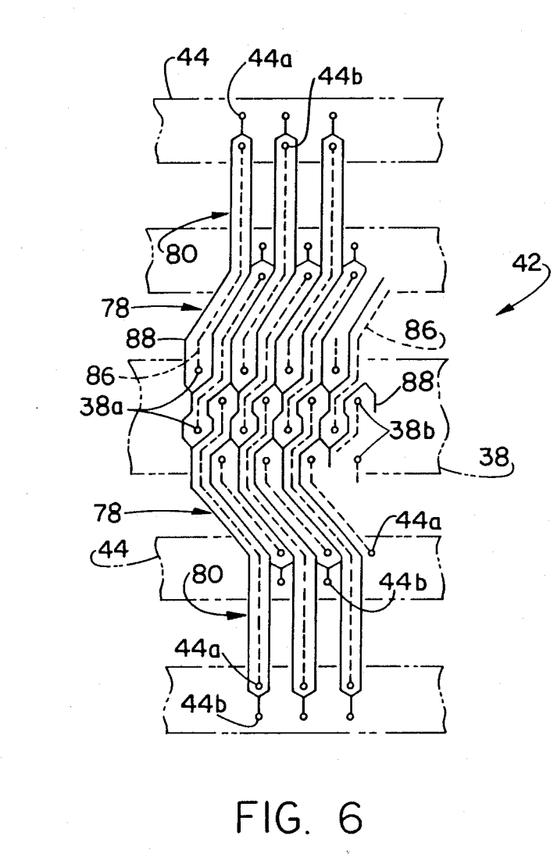
FIG. 6 is a detailed view of a portion of the apparatus of FIG. 5.

FIG. 6 shows in greater detail a portion of the conductive traces 78 and 80. The ribbon connectors 44 are shown in phantom. The high density connector 38 on the other side of the substrate 40 is also shown in phantom.

Conductive detector traces 86 are deposited on the substrate 40 and join each pin 44b of the ribbon connectors to a corresponding pin 38d of the high density connector 38. For clarity, the detector traces 86 are shown with dashed lines. Grounded traces 88 are deposited between and around the detector traces 86. Thus, each detector trace 86 is isolated from each of the other detector traces 86 by grounded tree 88. In other words, an alternating series of conductive detector traces 86 and conductive grounded traces 88 is provided. Typically, these detector and ground traces are approximately five to seven mils wide and are approximately five mils apart. The detector and ground traces 64, 86, and 88 may be deposited on the substrates in a manner described in U.S. Pat. No. 4,570,071.

The separation of the detector traces 86 by grounded traces 88 minimizes the distortion created by interference between the detector traces. The grounded traces 88 adjacent the detector traces 86 substantially reduce electrical cross talk between detector traces resulting from electrical fields created by current flowing in the detector traces 86. Also, the grounded traces 88 reduce charge leakage from one detector trace 86 to another. Any leaking charges are carried by a grounded trace 88 to an electrical ground. Finally, the distortion caused by contamination and humidity are also reduced. Thus, distortion of the image of a part being inspected is minimized. Minimization of distortion by alternating grounded and signal traces is more fully disclosed in application Ser. No. 892,969, filed Aug. 4, 1986.

Figure 7:
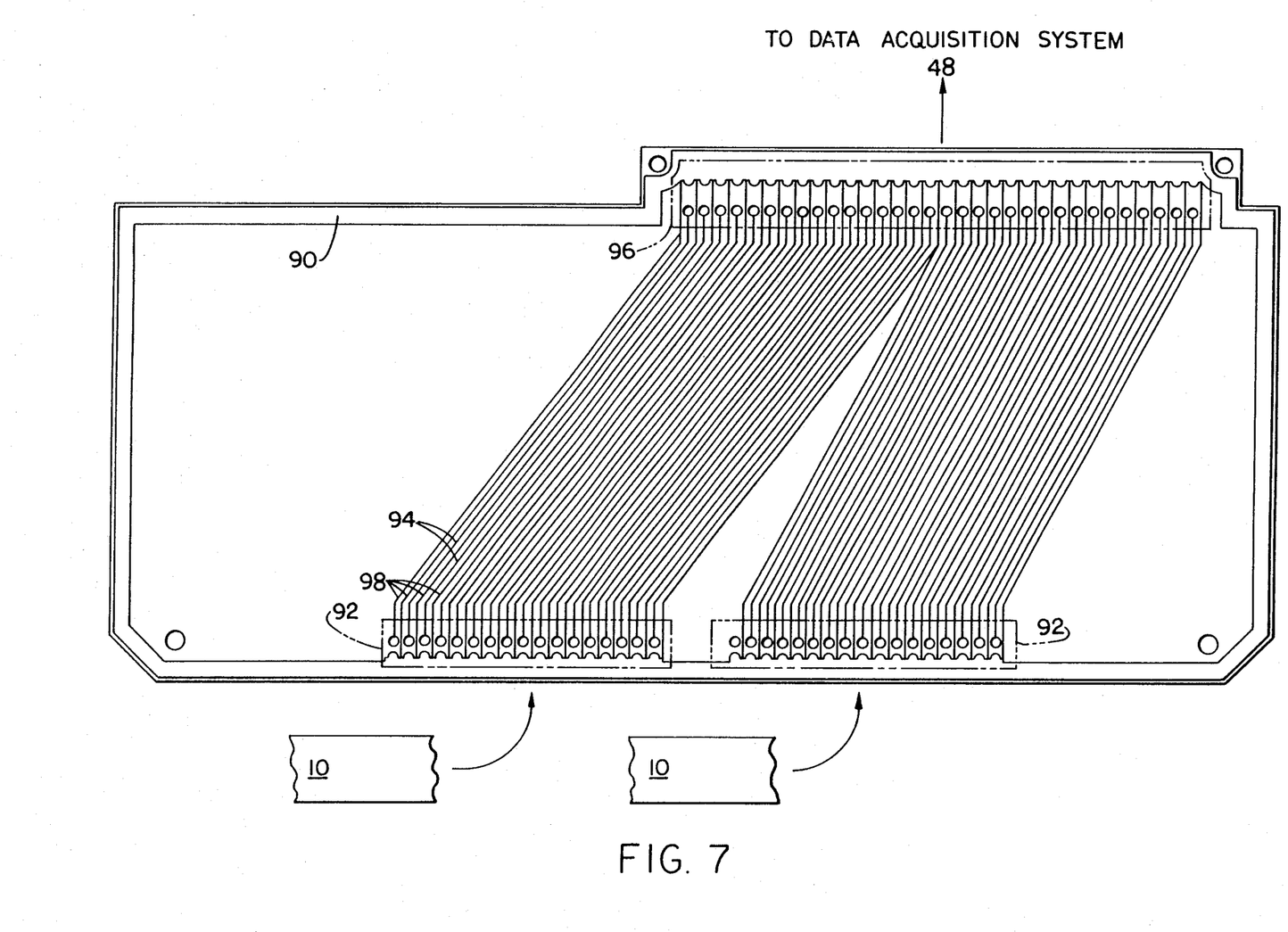
FIG. 7 is a top view of one of the circuit boards in FIG. 3.

FIG. 7 shows in greater detail the circuit board 47 of FIG. 3. That circuit board is used to provide an interface between the cable assemblies 10 and the connectors found on the Analogic Data Acquisition System mentioned above. The interface may be modified depending on the nature of the charge storage circuitry being used.

The circuit board is a dielectric substrate onto which is deposited a grounded conductor 90 around the edges. The ribbon cables are plugged into ribbon connectors 92 on one edge of the circuit board. The ribbon connectors connect each data channel 10a to a signal trace 94 deposited on the substrate. The signal traces connect the data channels to a data acquisition system connector 96 at the opposite edge of the circuit board. Connector 96 connects the circuit board 47 to the data acquisition system such that each data channel 10a is connected to a respective resistor 49, capacitor 50, and FET 52 combination shown in FIG. 3. Ground traces 98 are deposited on the substrate in the spaces between the signal traces 94 and are connected to the grounded conductor 90.

The electric cable assembly described in connection with FIGS. 1 and 2 is particularly advantageous in conducting the charge from the detector elements 64 to the charge storage circuitry 48. It reduces the effects of external electromagnetic fields and electrostatic charges which can quite significantly influence the low level signals involved in such an apparatus. It also resists deformation caused by mechanical vibrations in the vicinity of the cable assembly, which results in an unchanging cable capacitance. Thus, spurious signals impressed on the cable assembly due to mechanical vibrations are reduced. This is particularly important in an apparatus based on charge transfer to storage capacitors such as the apparatus of FIGS. 3–7. Because of all the factors mentioned above, the signal passed along the cable is a more accurate indication of the amount of penetrating radiation entering the chamber of the ionization detector.

I claim:

1. An apparatus for collecting charge resulting from ionization of a dielectric by electromagnetic energy, comprising:
   a plurality of conductive detector traces deposited on a nonconductive substrate;
   a plurality of elongated conductors oriented such that the longitudinal axes of the conductors are generally parallel to each other, each of the conductors being connected to one of the detector traces;
   a conductive shield surrounding each of the conductors, each of the shields being separated from its respective conductor by a dielectric layer;
   a dielectric material encasing and separating the plurality of shielded conductors;
   a first conductive shield surrounding the dielectric material and attached to the dielectric material by way of a first adhesive layer between the first conductive shield and the dielectric material;
   a second conductive shield surrounding the first conductive shield and attached to the first conductive shield by way of a second adhesive layer between the first conductive shield and the second conductive shield; and
   a charge storage means connected to the conductors.

2. The apparatus of claim 1, in which the charge storage means comprises a storage capacitor connected to each conductor.

3. The apparatus of claim 2, further comprising a means for sampling the charge on each storage capacitor.

4. The apparatus of claim 3, in which the sampling means comprises:
   a switching means connected to the storage capacitor; and an amplifier connected to the switching means, the output of the amplifier being capacitively coupled to the input of the amplifier.

5. The apparatus of claim 1, in which the adhesive layers are comprised of light to medium tack transfer adhesive.

6. The apparatus of claim 5, in which each of the first and second shields is a laminate of copper and polyester.

7. The apparatus of claim 1, in which each of the first and second shields is a laminate of copper and polyester.

8. The apparatus of claim 1, in which the axes of the conductors arranged so that the cable assembly is in the form of a ribbon.

9. The apparatus of claim 1, in which the conductive shields surrounding the conductors, the first conductive shield, and the second conductive shield are connected to drain wires to be connected to a circuit ground.

* * * * *